United States Patent
Yoshida (10) Patent No.: US 10,218,036 B2
(45) Date of Patent: Feb. 26, 2019

(54) BATTERY PACK, ELECTRICAL DEVICE, AND CONTROL METHOD THEREFOR

(71) Applicant: NEC Energy Devices, Ltd., Sagamihara-shi, Kanagawa (JP)

(72) Inventor: Tadahiro Yoshida, Kanagawa (JP)

(73) Assignee: NEC Energy Devices, Ltd., Sagamihara-shi, Kanagawa (JP)

( * ) Notice: Subject to any disclaimer, the term of this patent is extended or adjusted under 35 U.S.C. 154(b) by 122 days.

(21) Appl. No.: 14/775,194

(22) PCT Filed: Feb. 19, 2014

(86) PCT No.: PCT/JP2014/053866
§ 371 (c)(1),
(2) Date: Sep. 11, 2015

(87) PCT Pub. No.: WO2014/141834
PCT Pub. Date: Sep. 18, 2014

(65) Prior Publication Data
US 2016/0036096 A1    Feb. 4, 2016

(30) Foreign Application Priority Data

Mar. 13, 2013  (JP) ................ 2013-050085

(51) Int. Cl.
*H01M 10/42* (2006.01)
*G01R 31/36* (2006.01)
(Continued)

(52) U.S. Cl.
CPC ...... *H01M 10/425* (2013.01); *G01R 31/3679* (2013.01); *H01M 10/482* (2013.01);
(Continued)

(58) Field of Classification Search
None
See application file for complete search history.

(56) References Cited

U.S. PATENT DOCUMENTS

2010/0241377 A1* 9/2010 Kagawa ............ H01M 10/441 702/63
2011/0089907 A1* 4/2011 Bhardwaj .......... G01R 31/3662 320/136
(Continued)

FOREIGN PATENT DOCUMENTS

JP    07-130402 A    5/1995
JP    09-269360 A   10/1997
(Continued)

OTHER PUBLICATIONS

Battery University Group, hereinafter "BUG," BU-205: Types of Lithium-ion, available at http://batteryuniversity.com/index.php/learn/article/types_of_lithium_ion, last visited Jun. 28, 2018 (Year: 2011).*

(Continued)

*Primary Examiner* — Scott J. Chmielecki
(74) *Attorney, Agent, or Firm* — Foley & Lardner LLP (57) ABSTRACT

Provided is a battery pack capable of more reliably preventing adverse effects from being externally exerted. MCU (26) measures, as index values pertaining to the deterioration state of battery unit (1), at least two or more from among: a capacity reduction rate that is the reduction rate of the full-charge capacity of battery unit (1) from an initial value; a cycle count representing the number of times that a cycle, in which battery unit (1) is charged until the cumulative value of charge quantities charged to battery unit (1) reaches a prescribed charge quantity, has been performed; the number of times that battery unit (1) has been charged; time elapsed from the manufacturing of battery unit (1); cell voltages that are the voltages of secondary battery cells 11; and determines whether battery unit (1) has reached its end of life by using the measured index values. Monitoring IC 25

(Continued)

suspends the use of battery unit (1) when battery unit (1) has reached its end of life.

9 Claims, 4 Drawing Sheets

(51) Int. Cl.
  *H01M 10/63* (2014.01)
  *H01M 10/633* (2014.01)
  *H01M 10/48* (2006.01)
  *H01M 10/0525* (2010.01)
(52) U.S. Cl.
  CPC ......... *H01M 10/486* (2013.01); *H01M 10/63* (2015.04); *H01M 10/633* (2015.04); *H01M 10/0525* (2013.01); *H01M 2010/4271* (2013.01); *H01M 2220/20* (2013.01)

(56) References Cited

U.S. PATENT DOCUMENTS

| | | | | |
|---|---|---|---|---|
| 2013/0033102 A1* | 2/2013 | Goff | ...................... | H02J 7/0014 307/10.6 |
| 2013/0049762 A1* | 2/2013 | Ogg | ..................... | G01R 31/362 324/433 |
| 2014/0139191 A1* | 5/2014 | Asghari | ................ | H01M 10/48 320/134 |
| 2014/0152232 A1* | 6/2014 | Johnson | ................ | H02J 7/0014 320/103 |
| 2014/0229129 A1* | 8/2014 | Campbell | ................ | H04Q 9/00 702/63 |
| 2014/0242432 A1* | 8/2014 | Brown | ................ | H01M 10/482 429/90 |
| 2015/0079433 A1* | 3/2015 | Tamai | ................... | H01M 10/48 429/62 |
| 2015/0130404 A1* | 5/2015 | Luo | ....................... | H02J 7/0016 320/107 |
| 2015/0364935 A1* | 12/2015 | Fetzer | ................ | H01M 10/425 318/139 |
| 2016/0294019 A1* | 10/2016 | Yamauchi | ................ | H02J 7/02 |

FOREIGN PATENT DOCUMENTS

| | | |
|---|---|---|
| JP | 09-293539 A | 11/1997 |
| JP | 2008-277136 A | 11/2008 |
| JP | 2010-166752 A | 7/2010 |
| JP | 2011-053097 A | 3/2011 |
| JP | 2012-168728 A | 9/2012 |

OTHER PUBLICATIONS

International Search Report dated Apr. 22, 2014 in PCT/JP2014/053866 with English-language translation (4 pgs.).

* cited by examiner

BATTERY PACK, ELECTRICAL DEVICE, AND CONTROL METHOD THEREFOR

TECHNICAL FIELD

The present invention relates to a battery pack including secondary battery cells, and more particularly to a battery pack including lithium-ion secondary battery cells.

BACKGROUND ART

In recent years, as a power source for an electrical device, there has been used a battery pack including secondary battery cells such as lithium-ion secondary battery cells.

The secondary battery cell included in the battery pack deteriorates depending on time elapsed from manufacturing, a cycle count representing the number of times that charging/discharging has been carried out, or the like, and the progress of the deterioration is accompanied by a reduction in the full-charge capacity of the secondary battery cell. In addition, when the deterioration of the secondary battery cell progresses to a prescribed level or more, not only the full-charge capacity may decline but also bulging or liquid leakage may occur in the secondary battery cell, thus exerting adverse effects on the electrical device including the battery pack. The full-charge capacity means a maximum power amount storable in the secondary battery cell.

For example, when bulging occurs in the secondary battery cell, the bulged secondary battery cell may press against the structural member (e.g., case) of the electrical device causing deformation of the device. When leakage of liquid occurs in the secondary battery cell which causes leaked electrolyte to stick to electronic components in the electrical device, the conductive electrolyte may migrate thereby causing deterioration of the electronic component.

Therefore, in some battery packs, protection circuits for suspending the use of the secondary battery cells before the secondary battery cells exert any adverse effect on the electrical device are provided.

The protection circuit of the battery pack measures the full-charge capacity or the direct-current resistance of the secondary battery cell, and predicts the deterioration state (State Of Health: SOH) of the secondary battery cell based on the measured value. The protection circuit then halts, based on the deterioration state, use of the secondary battery cell before the secondary battery cell can exert any adverse effect on the electrical device.

SUMMARY

Problems to be Solved by Invention

However, depending on the intended use of the battery pack, it may be difficult to measure the full-charge capacity or the direct-current resistance.

For example, when the battery pack is used as a power source for a power assisted electric bicycle, power supplied from the battery pack is used to power the motor. Usually, however, since to power the motor is carried out under pulse control, no constant current flows through the battery pack. Depending on the traveling state, for example, whether the power assisted electric bicycle is traveling on a slope, the current that flows through the battery pack changes. It is therefore difficult to measure the direct-current resistance. Further, depending on the region, time zone, or season in which the power assisted electric bicycle is used, the temperature of the battery pack changes. Since the direct-current resistance of the battery pack becomes higher as the temperature of the battery pack becomes lower, even if the direct-current resistance can be measured, it is very difficult to predict the deterioration state.

In addition, in the electrical device such as the power assisted electric bicycle, the secondary battery cell is not always used from a full-charge state to a full-discharge state. For some users, discharging and charging in which charge and discharge quantities are small may be repeated. In such a case, it is difficult to measure the full-charge capacity.

In particular, the use of a manganese spinel ion battery cell using manganese (Mn) (more specifically, manganese spinel) for the positive electrode of secondary battery cell causes a problem in which reliably measuring full-charge capacity becomes very difficult.

Figure 1:
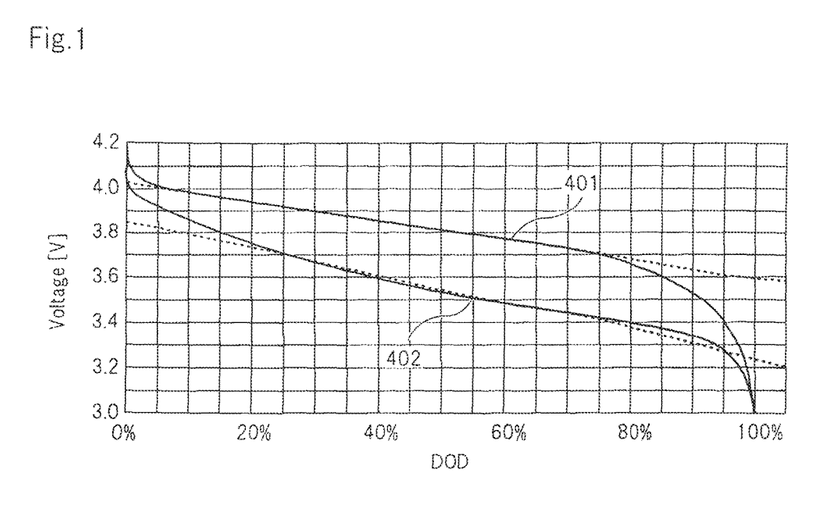
FIG. 1 is a graph illustrating the problem of related art.

FIG. 1 is a graph illustrating the cause of the above-mentioned problem in detail. FIG. 1 illustrates manganese spinel characteristic curve 401 indicating the relationship between the depth of discharge (DOD) and a discharge voltage (Voltage) in a manganese spinel lithium-ion secondary battery cell, and ternary characteristic curve 402 indicating the relationship between the depth of discharge and a discharge voltage in a ternary lithium-ion secondary battery cell. The ternary lithium-ion secondary battery cell is a lithium-ion secondary battery cell that uses cobalt (Co), nickel (Ni), and manganese for the positive electrode.

As illustrated in FIG. 1, in both the manganese spinel lithium-ion secondary battery cell and the ternary lithium-ion secondary battery cell, the discharge voltage gradually decreases from the full-charge state. Accordingly, the full-charge capacity can be measured by measuring the open circuit voltage. However, since the temperature and the discharge current of the battery pack are not always constant as described above, when the secondary battery cell is in a power-conductive state in the electrical device, voltage fall is not always constant. The measured value of the full-charge capacity thus deviates from an actual value, thereby making it very difficult to reliably measure full-charge capacity. In particular, in the case of the manganese spinel lithium-ion, secondary battery cell, the falling of the discharge voltage slowly progresses, and thus deviation between the discharge voltage and the open circuit voltage or the like causes the measured value of the full-charge capacity to be greatly deviated from the actual value, As a result, it is very difficult to reliably measure the full-charge capacity.

The present invention has been made in view of the above-mentioned problems, and provides a battery pack capable of more reliably preventing adverse effects from being externally exerted, an electrical device, and a control method therefor.

Solution To Problem

A battery pack according to an exemplary aspect of the present invention is a battery pack including:

a battery unit that includes secondary battery cells; a determination unit that measures, as index values pertaining to a deterioration state of the battery unit, at least two or more from among: a capacity reduction rate that is a reduction rate of a full-charge capacity of the battery unit from an initial value; a cycle count representing the number of times that a cycle, in which the battery unit is charged until a cumulative value of charge quantities charged to the battery unit reaches a prescribed charge quantity, has been performed; the number of times that the battery unit has been charged; time elapsed from manufacturing of the battery unit; and cell voltages that are voltages of the secondary battery cells; and determines whether the battery unit has reached its end of life by using the measured index values; and a suspension unit that suspends use of the battery unit when the battery unit has reached its end of life.

An electrical device according to an exemplary aspect of the present invention includes the battery pack.

A method for controlling a battery pack according to an exemplary aspect of the present invention is a method for controlling a battery pack including a battery unit that includes secondary battery cells, the method comprising:

measuring, as index values pertaining to a deterioration state of the battery unit, at least two or more from among: a capacity reduction rate that is a reduction rate of a full-charge capacity of the battery unit from an initial value; a cycle count representing the number of times that a cycle, in which the battery unit is charged until a cumulative value of charge quantities charged to the battery unit reaches a prescribed charge quantity, has been performed; the number of times that the battery unit has been charged; time elapsed from manufacturing of the battery unit; and a cell voltage that is a voltage between both electrodes of the secondary battery cell;

determining whether the battery unit has reached its end of life by using the measured index values; and suspending use of the battery unit when the battery unit has reached its end of life.

EFFECTS OF INVENTION

According to the present invention, adverse effects can be more reliably prevented from being externally exerted.

EXEMPLARY EMBODIMENT

Hereinafter, the embodiments of the present invention will be described with reference to the drawings. In the description below, units having similar functions will be denoted by similar reference signs, and description thereof may be omitted.

Figure 2:
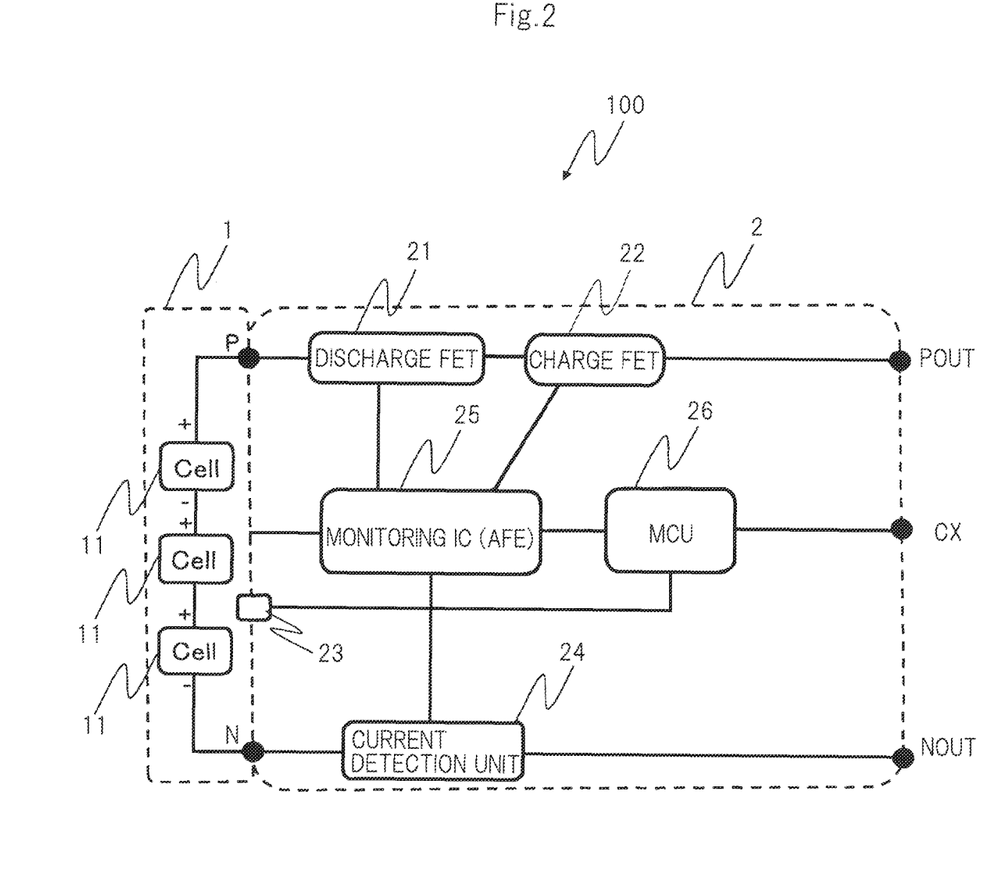
FIG. 2 is a block diagram illustrating the configuration of a battery pack according to the embodiment of the present invention.

FIG. 2 is a block diagram illustrating the configuration of a battery pack according to the embodiment of the present invention. In FIG. 2, battery pack 100 includes battery unit 1 and protection unit (Battery Management Unit: BMU) 2. Battery pack 100 is connected to an electrical device (not illustrated in FIG. 2) to function as a power source for the electrical device. The electrical device is a mobile body such as a power assisted electric bicycle, an electric motor cycle, or an electric automobile. It should be noted that the electrical device is not limited to the mobile body, but other devices such as a portable telephone or the like may be used.

Battery unit 1 includes chargeable and dischargeable secondary battery cells (Cells) 11, positive electrode terminal P, and negative electrode terminal N.

According to the embodiment, it is assumed that battery unit 1 has a configuration in which a plurality of secondary battery cells 11 are connected in series. However, battery unit 1 may be configured by a single secondary battery cell or by connecting a plurality of secondary battery cells in parallel or in a matrix form. The number and the arrangement of secondary battery cells are appropriately determined according to the type of the electrical device or the type of the secondary battery cell.

Secondary battery cell 11 is, for example, a lithium-ion secondary battery cell, but there is no restriction on the type of secondary battery cell 11. As lithium-ion secondary battery cells, there are available a manganese spinel lithium-ion secondary battery cell using manganese for the positive electrode, a ternary lithium-ion secondary battery cell using cobalt, nickel, and manganese for the positive electrode, and the like.

Protection unit 2 is connected to battery unit 1 (specifically, positive electrode terminal P and negative electrode terminal N) to protect the electrical device connected to battery unit 1 or battery pack 100.

Specifically, protection unit 2 includes discharge FET (Field effect transistor) 21, charge FET 22, temperature sensor 23, current detection unit 24, monitoring IC (integrated circuit) 25, and MCU (Micro Control unit) 26. Protection unit 2 additionally includes positive electrode output terminal POUT and negative electrode output terminal NOUT to enable current flow between the battery and the electrical device, and communication terminal CX for communicating with the electrical device. A plurality of communication terminals CX may be provided.

Discharge FET 21 is a switch for controlling the discharge current output from battery unit 1, and charge FET 22 is a switch for controlling the charge current supplied to battery unit 1. Discharge FET 21 and charge FET 22 are provided between positive electrode terminal P and positive electrode output terminal POUT of battery unit 1 in FIG. 2. However, discharge FET 21 and charge FET 22 may be provided between negative electrode terminal N and negative electrode output terminal NOUT of battery unit 1. A circuit breaker or a rely may be used instead of the FET as a switch to control the discharge current or the charge current.

Temperature sensor 23 is a temperature detection unit for detecting the temperature of battery unit 1. A plurality of temperature sensors 23 may be provided. In such a case, respective temperature sensors 23 measure the temperatures of the different parts of battery unit 1.

Current detection unit 24 detects the charge current and the discharge current of battery unit 1. According to the embodiment, current detection unit 24 is provided between negative electrode terminal N and negative electrode output terminal NOUT of battery unit 1. However, current detection unit 24 may be provided between positive electrode terminal P and positive electrode output terminal POUT of battery unit 1. Hereinafter, the charge current and the discharge current of battery unit 1 may be collectively referred to as a charge and discharge current.

Monitoring IC 25 functions as a voltage detection unit for detecting cell voltage that is the voltage between both electrodes of each secondary battery cell 11, and also functions as a suspension unit for suspending the use of battery unit 1 by using discharge FET 21 and charge FET 22.

Monitoring IC 25 may be also referred to as an Analog Front End (AFE). The sum total of cell voltages is the voltage of battery unit 1.

When functioning as the suspension unit, specifically, if MCU 26 determines that battery unit 1 has reached its end of life, monitoring IC 25 turns OFF at least one of discharge FET 21 and charge FET 22, and cuts off the connection between battery unit 1 and the electrical device to suspend the use of battery unit 1. At this time, when discharge FET 21 is turned OFF, the power supply to the electrical device may suddenly stop, thereby inconveniencing the user. Therefore, it is desired that monitoring IC 25 suspend charging battery unit 1 by turning OFF charge FET 22.

MCU 26 may also be referred to as a determination unit. MCU 26 measures, as index values pertaining to the deterioration state of battery unit 1, at least two or more from among: a capacity reduction rate that is the reduction rate of the full-charge capacity of battery unit 1 from an initial value; the cycle count of battery unit 1; the number of times that battery unit 1 has been charged; time elapsed from the manufacturing of battery unit 1; and the cell voltages of respective secondary battery cells 11 of battery unit 1. At this time, it is desired that MCU 26 measure at least both the cycle count and the elapsed time as the index values. The cycle count of battery unit 1 specifically represents the number of times that a cycle (cycle step), in which battery unit 1 is charged until the cumulative value of charge quantities charged to battery unit 1 reaches a prescribed charge quantity, has been performed.

MCU 26 determines whether battery unit 1 has reached its end of life by using the measured index values. Specifically, MCU 26 determines, for each of the index values, whether the index value satisfies a cycle life condition corresponding to the index value, and determines whether battery unit 1 has reached its end of life based on the result of the determination.

For example, MCU 26 determines that battery unit 1 has reached its end of life when the number of index values satisfying the cycle life conditions is equal to or greater than a prescribed number, and determines that battery unit 1 has not reached its end of life when the number of index values satisfying the cycle life conditions is smaller than the prescribed number. The prescribed number can be arbitrarily set as long as it is equal to or greater than 1 and equal to or smaller than the number of measured index values. According to the embodiment, the prescribed number is set to 1.

The battery cycle life conditions may be set in MCU 26 in advance, or set in MCU 26 externally through communication terminal CX. When battery unit 1 has reached its end of life, or a little before battery unit 1 reaches its end of life, MCU 26 may transmit a signal notifying that battery unit 1 has reached its end of life or a signal notifying that battery unit 1 is approaching its end of life to the electrical device via communication terminal C.

Next, determination processing for determining whether the index values satisfy the battery cycle life conditions will be described in more detail. Hereinafter, secondary battery cell 11 is a manganese spinel lithium-ion secondary battery cell, and a numerical range pertaining to the battery cycle life conditions below is set so as to determine that battery unit 1 has reached its end of life when the actual capacity reduction rate of battery unit 1 is about 50%. The value of the capacity reduction rate for determining that battery unit 1 has reached its end of life is a value determined according to the characteristics of secondary battery cell 11, and may be smaller than 50% as long as no adverse effect is exerted on the electrical device.

(1) Capacity Reduction Rate

When the capacity reduction rate is used as the index value, first, MCU 26 determines whether the charging rate of battery unit 1 has reached a prescribed charging rate based on the discharge current detected by current detection unit 24, the battery temperature detected by temperature sensor 23, and the cell voltage of each secondary battery cell 11 detected by monitoring IC 25.

Specifically, MCU 26 holds an internal table showing a correspondence relationship among the discharge current, battery temperature, and the cell voltage threshold value that is the cell voltage when the charging rate has reached the prescribed charging rate, calculates the cell voltage threshold value by using the detected discharge current, the detected battery temperature, and the internal table, and determines that the charging rate of battery unit 1 has reached the prescribed charging rate when the detected cell voltage is equal to or lower than the cell voltage threshold value. The prescribed charging rate is desired to be a charging rate when the discharge voltage of battery unit 1 falls steeply, and about 15% when secondary battery cell 11 is a manganese spinel lithium-ion secondary battery cell.

When the charging rate has reached the prescribed charging rate, MCU 26 calculates a current full-charge capacity based on the cumulative value of discharge currents thus far. For example, when the prescribed charging rate is 15%, MCU 26 calculates the current full-charge capacity by dividing the cumulative value of discharge currents by 0.85.

Subsequently, MCU 26 compares the calculated full-charge capacity with the preset initial value of the full-charge capacity to measure the capacity reduction rate.

Then, MCU 26 determines whether the measured capacity reduction rate satisfies a reduction rate condition that is a battery cycle life condition corresponding to the capacity reduction rate. The reduction rate condition is, for example, the condition in which the capacity reduction rate is smaller than a preset reduction rate threshold value. The reduction rate threshold value is, for example, within the range of 40% to 60%.

Since the resistance value of battery unit 1 becomes higher as the battery temperature that is the temperature of battery unit 1 becomes lower, the measurement error of the discharge voltage of battery unit 1 is larger. Thus, the measurement error of the capacity reduction rate is excessively large when the battery temperature reaches a certain level or less. It is therefore desired that, when the battery temperature that is the temperature detected by temperature sensor 23 is equal to or lower than a prescribed temperature, MCU 26 suspend the determination carried out as to whether battery unit 1 has reached its end of life by using the capacity reduction rate or set the reduction rate threshold value lower than that when the battery temperature is higher than the prescribed temperature. For example, MCU 26 sets the reduction rate threshold value to 50% when the battery temperature is higher than the prescribed temperature, and sets the reduction rate threshold value to 40% when the battery temperature is equal to or lower than the prescribed temperature. The prescribed temperature is, for example, within the range of 0° C. to 15° C.

When there is a plurality of temperature sensors 23, it is desired that the statistical value of the temperature detected by temperature sensor 23 be used as the battery temperature. The desired statistical value is a minimum value, but an average value or the like may be used.

(2) Cycle Count

When the cycle count is used as the index value, MCU 26 measures the cycle count of battery unit 1 based on the charge and discharge current detected by current detection unit 24 and the cell voltage of each secondary battery cell 11 detected by monitoring IC 25, and determines whether the cycle count satisfies a cycle count condition that is a battery cycle life condition corresponding to the cycle count. The cycle count condition is, for example, a condition in which the cycle count is equal to or greater than a preset cycle count threshold value. The cycle count threshold value is, for example, within the range of 700 times to 800 times.

For example, assuming that rated charging and discharging (e.g., charging and discharging with charging and discharging rate of 1 I tA) are carried out at the specific temperature (e.g., 20° C.) of battery unit 1 by a specific cycle count (e.g., 1000 cycles), when battery unit 1 reaches its end of life, in reality, the charging and the discharging are carried out at a rate greater than the rated charging and discharging or at a temperature that is higher than the specific temperature. Thus, in many cases, battery unit 1 reaches its end of life by a cycle count that is smaller than the specific cycle count. It is therefore desired that the cycle count threshold value be smaller than the specific cycle count.

The cycle count represents the number of times that the cumulative value of charge quantities charged to battery unit 1 has reached a prescribed charge quantity as described above. MCU 26 may set, in view of the deterioration state of battery unit 1 to a certain extent, the prescribed charge quantity to be smaller as the cycle count becomes larger. For example, MCU 26 sets the prescribed charge quantity to 10 Ah when the cycle count is within the range of 0 to 100 times, to 9 Ah when the cycle count is within the range of 101 times to 200 times, to 8 Ah when the cycle count is within the range of 201 times to 300 times, and to 7 Ah when the cycle count is equal to or greater than 300 times.

(3) Number of Charging Times

When the number of charging times is used as the index value, MCU 26 measures the number of times that charging to battery unit 1 has been started based on the charge and discharge current detected by current detection unit 24, and determines whether the number of charging times satisfies a frequency condition that is a battery cycle life condition corresponding to the number of charging times. The frequency condition is, for example, a condition in which the number of charging times is equal to or greater than a preset frequency threshold value.

Battery unit 1 and a charger (not illustrated) may be repeatedly attached and detached due to accidents or the like. Accordingly, when battery unit 1 has continuously been charged for a prescribed period of time (e.g., 30 seconds) or longer, MCU 26 may count up the number of charging times. The number of charging times is normally greater than the cycle count. It is therefore desired that the frequency threshold value be greater than the cycle count threshold value. The frequency threshold value is, for example, within the range of 1000 times to 1200 times.

The number of charging times may not be the number of times that charging battery unit 1 has been started but the number of times that battery unit 1 has been charged to the full-charge state. In this case, the frequency threshold value is, for example, within the range of 800 times to 1200 times.

Depending on the characteristics of secondary battery cell 11 determined according to the electrode materials of secondary battery cell 11, when secondary battery cell 11 is charged to or near full charge, the deterioration of secondary battery cell 11 may progress fast due to the charging. in such a secondary battery cell, the deterioration of secondary battery cell 11 progresses extremely faster when secondary battery cell 11 is charged to or near full charge than that when charging and discharging are repeated at a low charging rate. In this case, it is desired that MCU 26 measure, as the number of charging times, the number of times that charging has been carried out to the full-charge state. Secondary battery cells that deteriorate quickly when charged to or near the full charge are a nickel spinel lithium-ion secondary battery cell using nickel for the positive electrode and a cobalt spinel lithium-ion secondary battery cell using cobalt for the positive electrode.

When the number of charging times is the number of times that charging has been carried out to the full-charge state, if shallow charging and discharging are repeated, the number of charging times is not counted up. It is therefore desired that MCU 26 also use the cycle count as the index value when the number of charging times is used as the index value.

(4) Elapsed Time

When the elapsed time is used as the index value, MCU 26, which includes a clock (not illustrated) for measuring time, measures elapsed time by using the clock, and determines whether the elapsed time satisfies a time condition that is a life condition corresponding to the elapsed time. The time condition is, for example, a condition in which the elapsed time is equal to or longer than a preset time threshold value. The time threshold value is, for example, within the range of 3 years to 9 years.

Secondary battery cell 11 deteriorates more easily as the temperature becomes higher. Accordingly, MCU 26 may correct the measured elapsed time based on the battery temperature detected by temperature sensor 23, and determine whether battery unit 1 has reached its end of life by using corrected time that is the corrected elapsed time. In this case, MCU 26 desirably corrects the elapsed time so that the corrected time can be longer as the temperature becomes higher. For example, MCU 26 sets the elapsed time to be longer by 1 at a temperature of 20° C. or lower, longer by 1.2 times at a temperature higher than 20° C. and equal to or lower than 30° C., longer by 1.5 times at a temperature higher than 30° C. and equal to or lower than 40° C., and longer by twice at a temperature higher than 40° C. and equal to or lower than 50° C.

When there is a plurality of temperature sensors 23, it is desired that the statistical value of the temperature detected by temperature sensor 23 be used as the battery temperature. The desired statistical value is a maximum value, but the average value or the like may be used.

(5) Cell Voltage

When a plurality of secondary battery cells 11 are connected in series, since there is an individual difference in the degree of deterioration among secondary battery cells 11, the deviation amount in cell voltage among secondary battery cells 11 gradually increases. The deterioration of secondary battery cell 11 is accelerated more as the deviation amount between cell voltages becomes larger. Even when a cell balance circuit for reducing deviation between the cell voltages is included in battery pack 100, battery pack 100 may be used under the condition in which the cell balance circuit is not operated. For example, there are some cell balance circuits configured to reduce the deviation between the cell voltages when battery unit 1 is in or near a full-charge state. In this case, the deviation between the cell voltages cannot be reduced when a charging rate is low. The cell balance circuit can be configured to reduce the deviation between the cell voltages even when the charging rate of battery unit 1 is low. In this case, however, when battery unit 1 is charged, the voltage increase of the secondary battery cell that has a high degree of deterioration is greater than that of the secondary battery cell that has a low degree of deterioration, thus accelerating the deterioration of the secondary battery cell that has a high degree of deterioration.

Therefore, when the cell voltage is used as the index value, MCU 26 measures a deviation amount that is the difference between the maximum value and the minimum value of the cell voltages based on the cell voltage of each secondary battery cell 11 detected by monitoring IC 25, and determines whether the deviation amount satisfies a cell condition that is a battery cycle life condition corresponding to the cell voltage. The cell condition is, for example, a condition in which the deviation amount is equal to or higher than a preset cell threshold value. The cell threshold value is, for example, within the range of 100 mV to 200 mV.

As illustrated in FIG. 1, in the high or low range of the charging rate of battery unit 1, the cell voltage steeply changes according to the charging and the discharging of battery unit 1. In this case, the deviation amount may be larger. It is therefore desired that MCU 26 measure the charging rate of battery unit 1 based on the charge and discharge current detected by current detection unit 24 and the cell voltage of each secondary battery cell 11 detected by monitoring IC 25, and suspend, when the charging rate is not within a prescribed charging rate range, the determination carried out as to whether battery unit 1 has reached its end of life by using the cell voltage, or set the cell threshold value to be greater than that when the charging rate is within the prescribed charging rate range. The prescribed charging rate range is, for example, within the range of 20% to 80%.

Figure 3:
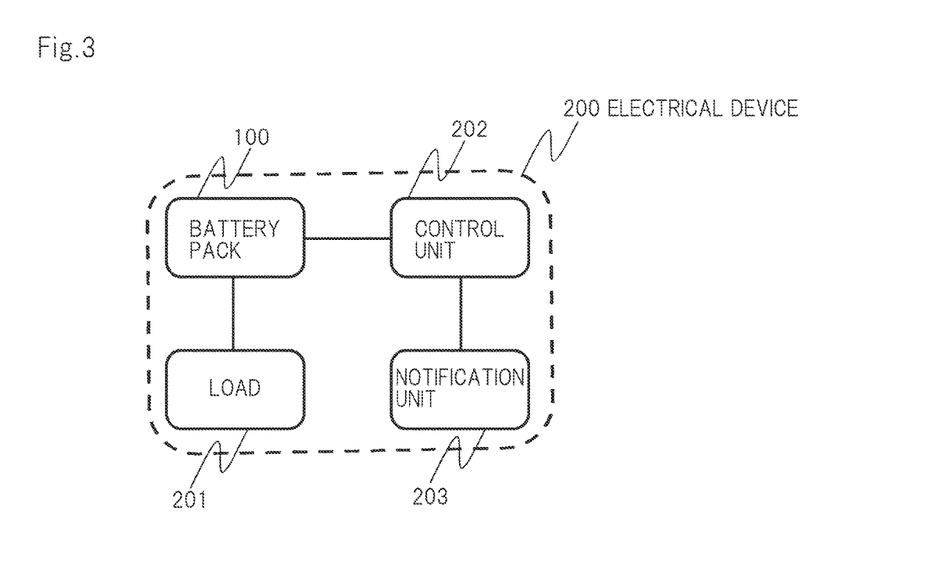
FIG. 3 is a block diagram illustrating the configuration of an electrical device according to the embodiment of the present invention.

Next, the electrical device that includes battery pack 100 will be described.

FIG. 3 is a block diagram illustrating the example of the configuration of the electrical device that includes battery pack 100. Electrical device 200 illustrated in FIG. 3 includes battery pack 100, load 201, control unit 202, and notification unit 203.

Load 201 is connected to positive electrode output terminal POUT and negative electrode output terminal NOUT of battery pack 100, and driven by power supplied from battery pack 100 via positive electrode output terminal POUT and negative electrode output terminal NOUT.

Control unit 202 is connected to communication terminal CX of battery pack 100, and receives a signal notifying that battery unit 1 has reached its end of life from battery pack 100 via communication terminal CX. When it has received the signal, control unit 202 issues a notification that battery unit 1 has reached its end of life to the user of the electrical device by using notification unit 203. Notification unit 203 is, for example, a monitor for displaying a message that battery unit 1 has reached its end of life, a speaker for outputting a voice message that battery unit 1 has reached its end of life, or a vibrator for notifying that battery unit 1 has reached its end of life by vibration.

Battery pack 100 may be attachable to/detachable from electrical device 200. Electrical device 200 may include a spare power source or the like in addition to battery pack 100.

Figure 4:
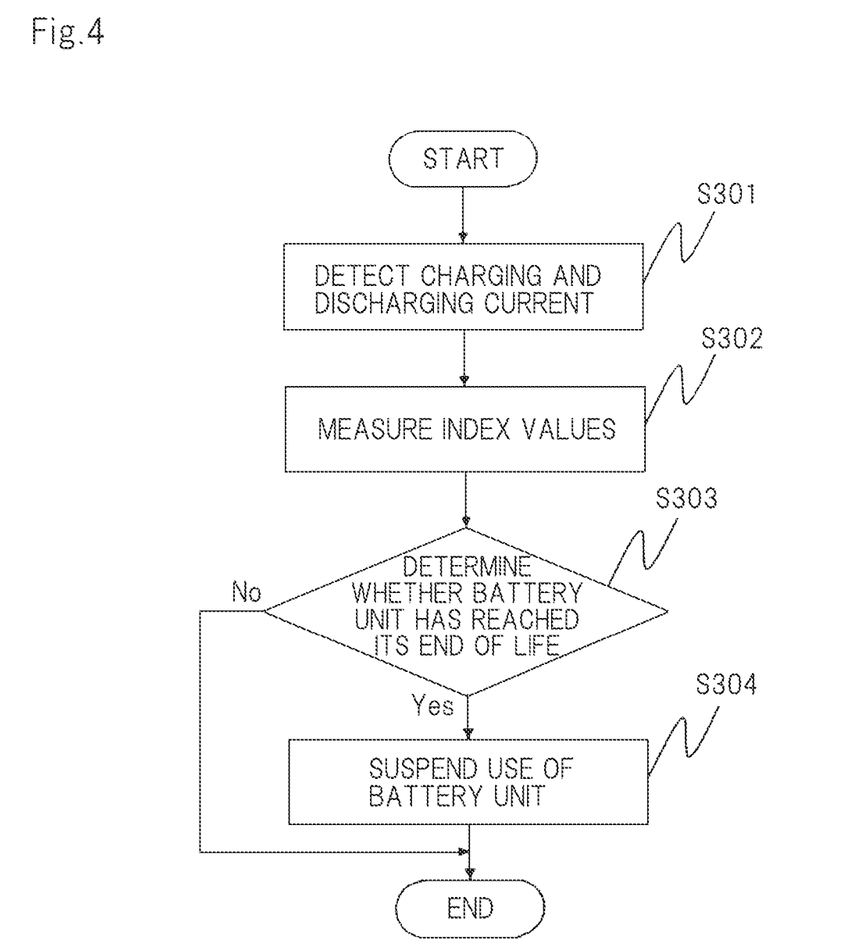
FIG. 4 is a flowchart illustrating the operation of the battery pack according to the embodiment of the present invention.

Next, the operation of battery pack 100 will be described.

FIG. 4 is a flowchart illustrating the example of the operation of battery pack 100. In battery pack 100, the following operation is periodically performed.

First, temperature sensor 23 detects the temperature of battery unit 1, and transmits a temperature signal indicating the temperature to monitoring IC 25. Current detection unit 24 detects the charging and discharging current of battery unit 1, and transmits a current signal indicating the charging and discharging current to monitoring IC 25. Monitoring IC 25 detects the cell voltage of each secondary battery cell 11, and receives the temperature signal and the current signal. Then, monitoring IC 25 transmits a voltage signal indicating each detected cell voltage and the received temperature and current signals to MCU 26 (step S301).

When it has received the voltage signal, the temperature signal, and the current signal, MCU 26 measures a plurality of index values based on the voltage signal, the temperature signal, and the current signal (step S302).

Then, MCU 26 determines whether battery unit 1 has reached its end of life by using the plurality of index values (step S303).

When battery unit 1 is yet to reach its end of life, MCU 26 ends the processing.

On the other hand, when battery unit 1 has reached its end of life, MCU 26 issues a signal notifying that battery unit 1 has reached its end of life to the electrical device via communication terminal CX, and a suspension request to suspend the use of battery unit 1 to monitoring IC 25. When it has received the suspension request, monitoring IC 25 turns OFF both discharge FET 21 and charge FET 22 to suspend the use of battery unit 1 (step S304), and then ends the processing.

As described above, according to the embodiment, as the index values pertaining to the deterioration state of battery unit 1, at least two or more from among the capacity reduction rate, the cycle count, the number of charging times, elapsed time and the cell voltage of battery unit 1 are measured, and whether the battery unit has reached its end of life is determined based on the index values. Thus, the deterioration state of battery unit 1 can be determined greater reliably than when the deterioration state is determined based on the full-charge capacity or the direct-current resistance. As a result, externally exerted adverse effects can be prevented more reliably.

According to the embodiment, since the prescribed charge quantity is smaller as the cycle count becomes larger, the deterioration state of battery unit 1 can be determined reliably.

According to the embodiment, since the number of times that the charging of battery unit 1 has been started and continued for the prescribed period of time or longer is measured as the number of charging times of battery unit 1, even when short-time charging is repeated due to accident or the like, the deterioration state of battery unit 1 can be determined reliably.

According to the embodiment, since the number of times that battery unit 1 has been charged to the full-charge state is measured as the number of charging times of battery unit 1, even when secondary battery cell 11 that has quickly deteriorated when charged to or near a full charge is used, the deterioration state of battery unit 1 can be determined reliably.

According to the embodiment, since the elapsed time is corrected based on the battery temperature, and whether battery unit 1 has reached its end of life is determined by using the corrected time that is the corrected elapsed time, the deterioration of battery unit 1 caused by the temperature can be taken into consideration. As a result, the deterioration state of battery unit 1 can be determined reliably.

According to the embodiment, when the battery temperature is equal to or lower than the prescribed temperature, the determination carried out as to whether battery unit 1 has reached its end of life by using the capacity reduction rate is suspended, or the reduction rate threshold value is set to be lower than that when the battery temperature is higher than the prescribed temperature. As a result, the deterioration state of battery unit 1 can be determined reliably.

According to the embodiment, when the charging rate of battery unit 1 is not within the prescribed charging rate range, the determination carried out as to whether battery unit 1 has reached its end of life by using the cell voltage is suspended, or the cell threshold value is set to be greater than that when the charging rate is within the prescribed charging rate range. As a result, the deterioration state of battery unit 1 can be determined reliably.

In the above-mentioned embodiment, the illustrated configuration is only an example, and in no way limitative of the present invention.

Some or all parts of the above-mentioned embodiment can be described as in the following appendixes, but are not limited to the appendixes.

[Appendix 1]
A battery pack comprising:
a battery unit that includes secondary battery cells;
a determination unit that measures, as index values pertaining to the deterioration state of the battery unit, at least two or more form among: a capacity reduction rate that is the reduction rate of the full-charge capacity of the battery unit from an initial value; a cycle count representing the number of times that a cycle, in which the battery unit is charged until the cumulative value of charge quantities charged to the battery unit reaches a prescribed charge quantity, has been performed; the number of times that the battery unit has been charged; time elapsed from the manufacturing of the battery unit; cell voltages that are the voltages of the secondary battery cells, and determines whether the battery unit has reached its end of life by using the measured index values; and
a suspension unit that suspends the use of the battery unit when the battery unit has reached its end of life.

[Appendix 2]
The battery pack according to Appendix 1, wherein the determination unit measures, as the index values, at least the cycle count and the elapsed time.

[Appendix 3]
The battery pack according to Appendix 1 or 2, wherein the determination unit measures, as the number of charging times, the number of times that the charging of the battery unit has been started and continued for a prescribed period of time or longer.

[Appendix 4]
The battery pack according to Appendix 1 or 2, wherein the determination unit measures, as the number of charging times, the number of times that the battery unit has been charged to a full-charge state.

[Appendix 5]
The battery pack according to any one of Appendixes 1 to 4, further comprising a temperature detection unit that detects the temperature of the battery unit,
wherein when measuring the elapsed time, the determination unit corrects the measured elapsed time based on the temperature, and determines whether the battery unit has reached its end of life by using corrected time that is the corrected elapsed time.

[Appendix 6]
The battery pack according to any one of Appendixes 1 to 5, wherein the determination unit determines, for each of the measured index values, whether the index value satisfies a battery cycle life condition corresponding to the index value, and determines whether the battery unit has reached its end of life based on the result of the determination.

[Appendix 7]
The battery pack according to Appendix 6, wherein:
the determination unit determines that the battery unit has reached its end of life when the number of index values satisfying the life conditions is equal to or greater than a prescribed number; and
the prescribed number is 1.

[Appendix 8]
The battery pack according to Appendix 6 or 7, wherein:
the battery cycle life condition corresponding to the capacity reduction rate is the condition in which the capacity reduction rate is smaller than a preset reduction rate threshold value; and
the reduction rate threshold value is within a range of 40% to 60%.

[Appendix 9]
The battery pack according to Appendix 8, further comprising a temperature detection unit that detects the temperature of the battery unit,
wherein when the temperature is equal to or lower than a prescribed temperature, the determination unit suspends the determination carried out as to whether the battery unit has reached its end of life by using the capacity reduction rate.

[Appendix 10]
The battery pack according to Appendix 8, further comprising a temperature detection unit that detects the temperature of the battery unit, wherein:
when the temperature is equal to or lower than a prescribed temperature, the determination unit sets the reduction rate threshold value to be lower than that when the temperature is higher than the prescribed temperature; and
the prescribed temperature is within the range of 0° C. to 15° C.

[Appendix 11]
The battery pack according to any one of Appendixes 6 to 10, wherein the battery cycle life condition corresponding to the cycle count is, for example, a condition in which the cycle count is equal to or greater than a preset cycle count threshold value.

[Appendix 12]
The battery pack according to any one of Appendixes 6 to 11, wherein the battery cycle life condition corresponding to the number of charging times is a condition in which the number of charging times is equal to or greater than a preset frequency threshold value.

[Appendix 13]
The battery pack according to any one of Appendixes 6 to 11, wherein:
the determination unit measures, as the number of charging times, the number of times that the battery unit has been charged to the full-charge state; and
the frequency threshold value is within the range of 1000 times to 1200 times.

[Appendix 14]
The battery pack according to any one of Appendixes 6 to 13, wherein:
the battery cycle life condition corresponding to the elapsed time is a condition in which the elapsed time is equal to or longer than a preset time threshold value; and
the time threshold value is within the range of 3 years to 9 years.

[Appendix 15]
The battery pack according to any one of Appendixes 6 to 14, wherein:
there is a plurality of secondary battery cells;
the battery cycle life condition corresponding to the cell voltage is a condition in which a deviation amount that is a difference between the maximum value and the minimum value of the cell voltages of the secondary battery cells is equal to or greater than a preset cell threshold value; and the cell threshold value is within the range of 100 mV to 200 mV.

[Appendix 16]

The battery pack according to Appendix 15, wherein the determination unit measures the charging rate of the battery unit, and suspends, when the charging rate is not within a prescribed charging rate range, the determination carried out as to whether the battery unit has reached its end of life by using the cell voltage.

[Appendix 17]

The battery pack according to any one of Appendixes 1 to 16, wherein the secondary battery cell is a manganese spinel lithium-ion secondary battery cell using manganese for a positive electrode.

[Appendix 18]

An electrical device comprising the battery pack according to any one of Appendixes 1 to 17.

[Appendix 19]

The electrical device according to Appendix 18, wherein the electrical device is a mobile body.

[Appendix 20]

A method for controlling a battery pack including a battery unit that includes secondary battery cells, the method comprising:

measuring, as index values pertaining to the deterioration state of the battery unit, at least two or more from among: a capacity reduction rate that is the reduction rate of the full-charge capacity of the battery unit from an initial value; a cycle count representing the number of times that a cycle, in which the battery unit is charged until the cumulative value of charge quantities charged to the battery unit reaches a prescribed charge quantity, has been performed; the number of times that the battery unit has been charged; time elapsed from the manufacturing of the battery unit; and a cell voltage that is a voltage between both the electrodes of the secondary battery cell;

determining whether the battery unit has reached its end of life by using the measured index values; and suspending the use of the battery unit when the battery unit has reached its end of life.

This application is based upon and claims the benefit of priority from Japanese patent application No. 2013-050085, filed on Mar. 13, 2013, the disclosure of which is incorporated herein in its entirety by reference.

REFERENCE SIGNS LIST

1 Battery unit
2 Protection circuit
11 Secondary battery cell
21 Discharge FET
22 Charge FET
23 Temperature sensor
24 Current detection unit
25 Monitoring IC
26 MCU
100 Battery pack
200 Electrical device
201 Load
202 Control unit
203 Notification unit

The invention claimed is:

1. A battery pack comprising:
a battery unit that includes secondary battery cells;
a determination unit programed to measure, as index values pertaining to a deterioration state of the battery unit, time elapsed from when the battery unit was manufactured, and said determination unit programed to determine whether the battery unit has reached its end of life by using the measured index values;
a suspension unit programed to suspend use of the battery unit when the battery unit has been determined to have reached its end of life; and
a temperature detection unit programed to detect a temperature of the battery unit,
wherein the determination unit is programed to correct the measured elapsed time based on the temperature and is programed to determine whether the battery unit has reached its end life by using corrected that is the corrected elapsed time.

2. The battery pack according to claim 1, wherein the determination unit is programmed to measure, as a number of charging times, the number of times that charging of the battery unit has been started and continued for a prescribed period of time or longer.

3. The battery pack according to claim 1, wherein the determination unit is programmed to measure, as a number of charging times, the number of times that the battery unit has been charged to a full-charge state.

4. The battery pack according to claim 1, wherein the determination unit is programmed to determine, for the measured index values, whether the index value satisfies a battery cycle life condition corresponding to the index value, and to determine whether the battery unit has reached its end of life based on a result of the determination.

5. The battery pack according to claim 4, wherein:
the determination unit is programmed to determine that the battery unit has reached its end of life when the number of index values satisfying the life conditions is equal to or greater than a prescribed number; and
the prescribed number is 1.

6. The battery pack according to claim 4, wherein:
the battery cycle life condition corresponding to a reduced capacity value, that is a value reduced from an initial value of a full-charge capacity of the battery unit, is a condition in which the reduced capacity value is smaller than a preset threshold value; and
the threshold value is within a range of 40% to 60%.

7. An electrical device comprising the battery pack according to claim 1.

8. A method for controlling a battery pack including a battery unit that includes secondary battery cells,
the method comprising the steps of:
measuring, as index values pertaining to a deterioration state of the battery unit, time elapsed from when the battery unit was manufactured;
detecting a tem erasure of the battery unit;
correcting the measured elapsed time based on the temperature;
determining whether the battery unit has reached its end of life by using corrected time that is corrected elapsed time; and
suspending use of the battery unit when the battery unit has been determined to have reached its end of life.

9. The battery pack according to claim 1, wherein the determination unit comprises a micro controller.

* * * * *